(12) United States Patent
Houle

(10) Patent No.: US 6,987,671 B2
(45) Date of Patent: Jan. 17, 2006

(54) COMPOSITE THERMAL INTERFACE DEVICES AND METHODS FOR INTEGRATED CIRCUIT HEAT TRANSFER

(75) Inventor: Sabina J. Houle, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 137 days.

(21) Appl. No.: 10/608,405

(22) Filed: Jun. 26, 2003

(65) Prior Publication Data

US 2004/0264136 A1    Dec. 30, 2004

(51) Int. Cl.
*H05K 7/20*    (2006.01)

(52) U.S. Cl. .............. 361/704; 165/80.3; 165/185; 257/707; 257/713; 361/705; 361/7; 361/707; 361/708; 428/119; 428/209

(58) Field of Classification Search ...... 165/80.2–80.3, 165/185; 257/706–707, 712–713, 710; 361/704–710, 361/716–721; 428/119, 122, 209, 125, 332, 428/339
See application file for complete search history.

(56) References Cited

U.S. PATENT DOCUMENTS

| | | | | |
|---|---|---|---|---|
| 3,790,866 A | * | 2/1974 | Meyer et al. | 257/702 |
| 5,146,314 A | * | 9/1992 | Pankove | 257/712 |
| 5,291,371 A | * | 3/1994 | Gruber et al. | 361/705 |
| 5,528,075 A | | 6/1996 | Burns | |
| 5,700,340 A | | 12/1997 | Johnson et al. | |
| 5,759,873 A | | 6/1998 | Kata et al. | |
| 5,904,796 A | | 5/1999 | Freuler et al. | |
| 5,907,189 A | * | 5/1999 | Mertol | 257/787 |
| 6,099,678 A | | 8/2000 | Kotato et al. | |
| 6,111,322 A | * | 8/2000 | Ando et al. | 257/778 |
| 6,226,187 B1 | | 5/2001 | Questad et al. | |
| 6,295,200 B1 | * | 9/2001 | Schmidt | 361/704 |
| 6,430,043 B1 | | 8/2002 | Osburn | |
| 6,504,242 B1 | | 1/2003 | Deppisch et al. | 257/707 |
| 6,667,548 B2 | * | 12/2003 | O'Connor et al. | 257/712 |
| 6,791,839 B2 | * | 9/2004 | Bhagwagar | 361/705 |
| 2001/0006041 A1 | | 7/2001 | Wensel | |
| 2003/0134454 A1 | | 7/2003 | Houle | |
| 2004/0180474 A1 | | 9/2004 | Oman | |
| 2004/0262743 A1 | * | 12/2004 | Houles et al. | |

* cited by examiner

*Primary Examiner*—Gregory Thompson
(74) *Attorney, Agent, or Firm*—Schwegman, Lundberg, Woessner & Kluth, P.A.

(57) ABSTRACT

A method and device for thermal conduction is provided. A thermal interface device and method of formation is described that includes advantages such as improved interfacial strength, and improved interfacial contact. Thermal interface devices are shown that include at least some degree of mechanical bonding through plastic deformation of metal. Embodiments of composite thermal interface devices are shown that provide reduced device cost by limiting use of expensive materials such as diamond, or gold. Device cost is also reduced in a number of embodiments by reducing a number of manufacturing steps in the formation of integrated circuit devices.

27 Claims, 5 Drawing Sheets

COMPOSITE THERMAL INTERFACE DEVICES AND METHODS FOR INTEGRATED CIRCUIT HEAT TRANSFER

TECHNICAL FIELD

The present invention relates generally to the field of heat transfer and, in particular, the present invention relates to thermal management of electronic devices.

BACKGROUND

In one embodiment, the present invention is used to transfer heat generated by electronic devices or groups of devices, such as transistors, as are commonly included on integrated circuit (IC) chips such as processor chips.

In the field of electronic systems there is an incessant competitive pressure among manufacturers to drive the performance of their equipment up while driving down production costs. This is particularly true regarding forming electronic devices such as transistors in IC's, where each new generation of IC must provide increased performance, particularly in terms of an increased number of devices and higher clock frequencies, while generally being smaller or more compact in size. As the density and clock frequency of IC's increase, they accordingly generate a greater amount of heat. However, the performance and reliability of IC's are known to diminish as the temperature to which they are subjected increases, so it becomes increasingly important to adequately dissipate heat from IC environments.

With the advent of high performance IC's and their associated packages, electronic devices have required more innovative thermal management to dissipate heat. Increasing speed and power in processors, for example, generally carry with it a "cost" of increased heat in the microelectronic die that must be dissipated. What is needed is a device and method to more effectively cool microelectronic dies containing IC's such as processors. What is also needed is a device and method that is less expensive and easier to manufacture.

DETAILED DESCRIPTION

Figure 1:
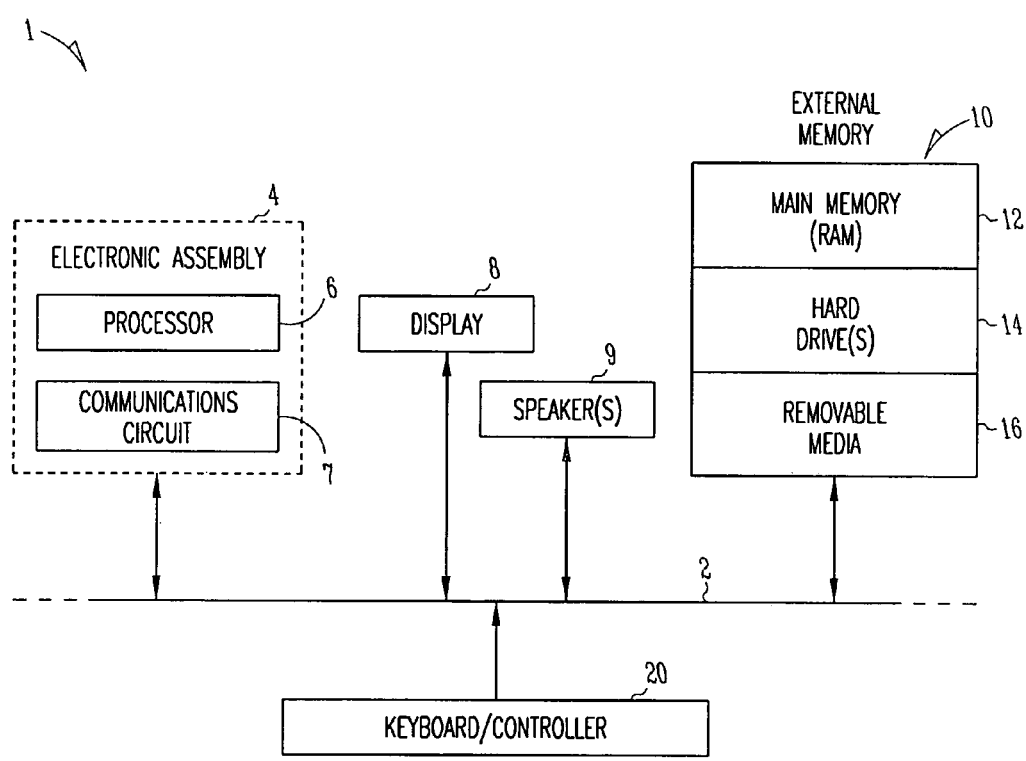
FIG. 1 illustrates an information handling device according to one embodiment of the invention.

In the following detailed description of the invention reference is made to the accompanying drawings which form a part hereof, and in which are shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized, and structural, logical, and electrical changes may be made, without departing from the scope of the present invention. The following detailed description is, therefore, not to be taken in a limiting sense, and the scope of the present invention is defined only by the appended claims.

The term "active side" as used in this description is defined as the conventional horizontal, large plane or surface of a chip or die where electrical devices have typically been fabricated, regardless of the orientation of the chip or die. The term "back side" as used in this description is defined as a conventional horizontal, large plane or surface of a chip or die that generally does not contain active devices on its surface. The term "vertical" refers to a direction perpendicular to the horizontal as defined above. Prepositions, such as "on", "higher", "lower", "above" and "below" are defined with respect to the conventional plane or surface being on the active side of the chip or die, regardless of the orientation of the chip or die.

An example of an information handling system using processor chips is included to show an example of a higher level device application for the present invention. FIG. 1 is a block diagram of an information handling system 1 incorporating at least one electronic assembly 4 utilizing a heat conducting device in accordance with at least one embodiment of the invention. Information handling system 1 is merely one example of an electronic system in which the present invention can be used. In this example, information handling system 1 comprises a data processing system that includes a system bus 2 to couple the various components of the system. System bus 2 provides communications links among the various components of the information handling system 1 and can be implemented as a single bus, as a combination of busses, or in any other suitable manner.

Electronic assembly 4 is coupled to system bus 2. Electronic assembly 4 can include any circuit or combination of circuits. In one embodiment, electronic assembly 4 includes a processor 6 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in electronic assembly 4 are a custom circuit, an application-specific integrated circuit (ASIC), or the like, such as, for example, one or more circuits (such as a communications circuit 7) for use in wireless devices like cellular telephones, pagers, portable computers, two-way radios, and similar electronic systems. The IC can perform any other type of function.

Information handling system 1 can also include an external memory 10, which in turn can include one or more memory elements suitable to the particular application, such as a main memory 12 in the form of random access memory (RAM), one or more hard drives 14, and/or one or more drives that handle removable media 16 such as floppy diskettes, compact disks (CD), digital video disk (DVD), and the like.

Information handling system 1 can also include a display device 8, one or more speakers 9, and a keyboard and/or controller 20, which can include a mouse, trackball, game controller, voice-recognition device, or any other device that permits a system user to input information into and receive information from the information handling system 1.

Although the present invention is found to be effective at transferring heat from IC surfaces, the invention is not limited to heat transfer from IC surfaces. The invention can be used in any setting where heat is to be conducted from one surface to another. For ease of explanation, the example of cooling an IC will be used.

Figure 2A:
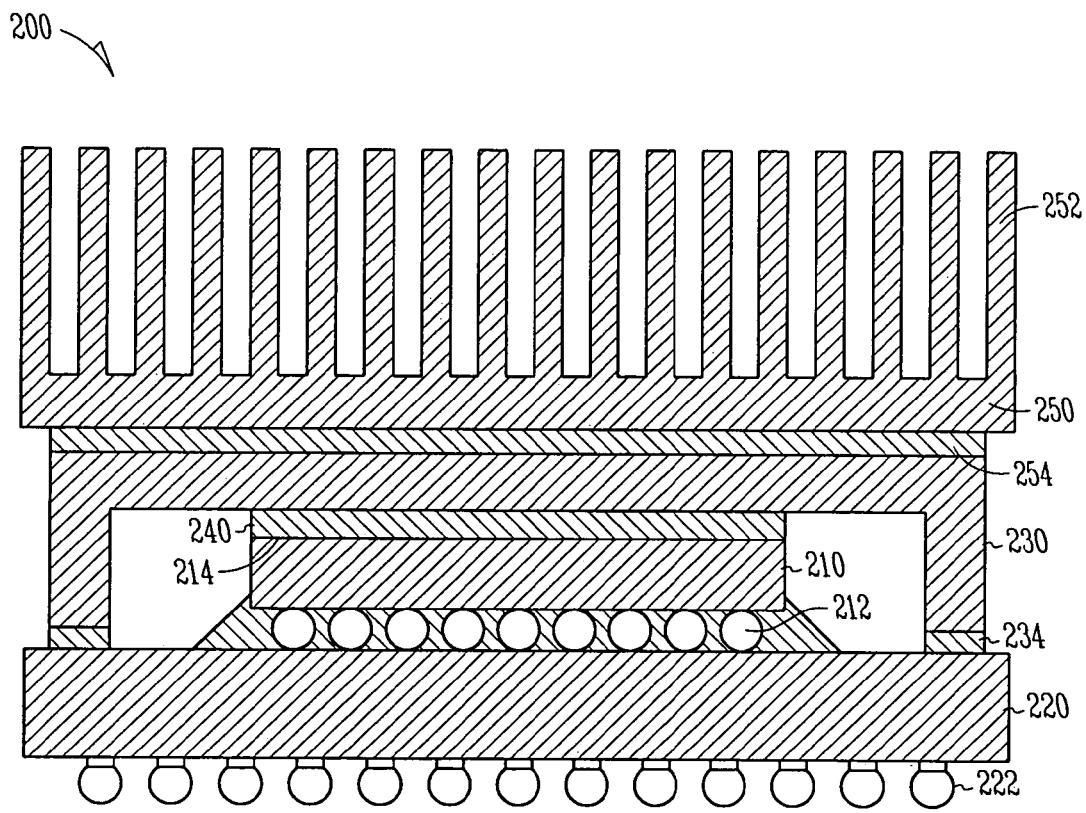
FIG. 2A illustrates a side view of a processor assembly according to one embodiment of the invention.

FIG. 2A shows a cross-sectional representation of an IC package 200. In embodiments where the IC die is a processor die, the IC package can be termed a processor assembly. IC package 200 includes an IC die 210 mounted in "flip-chip" orientation with its active side facing downward to couple with an upper surface of a substrate 220, such as a circuit board, through solder balls or bumps 212. Substrate 220 can be a one-layer board or a multi-layer board, and it can include additional contacts 222 on its opposite surface for mating with additional packaging structure (not shown).

Die 210 generates its heat from internal structure, including wiring traces, that is located near its active side; however, a significant portion of the heat is dissipated through its back side 214. Heat that is concentrated within the die is dissipated to a large surface that is in contact with the die in the form of an integrated heat spreader 230 that is typically formed of metal such as copper or aluminum. In one embodiment, the integrated heat spreader 230 is formed into a partial enclosure, and serves as a package cover for the die 210. In one embodiment, an adhesive 234 is further included to secure the integrated heat spreader 230 to the substrate 220. To improve the thermal conductivity between the die 210 and the integrated heat spreader 230, a thermal interface material 240 is often provided between the die 210 and integrated heat spreader 230.

In one embodiment, to further dissipate heat from the integrated heat spreader 230, a heat sink 250 optionally having fins 252 is coupled to the integrated heat spreader 230. Heat sink 250 dissipates heat into the ambient environment. In one embodiment a second thermal interface material 254 is further utilized to create a thermal pathway between the integrated heat spreader 230 and the heat sink 250.

The thermal interface material 240 shown in FIG. 2A is intended to be a general illustration of a thermal interface material or thermal interface device. In the following detailed description, specific details of thermal interface devices and assemblies are illustrated for given embodiments of the invention.

Figure 2B:
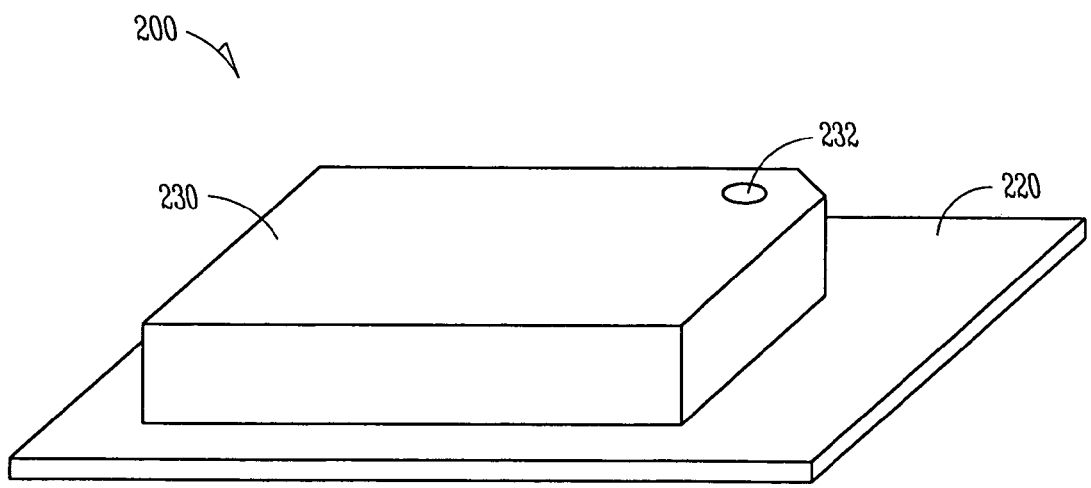
FIG. 2B illustrates an isometric view of a processor assembly according to one embodiment of the invention.

FIG. 2B shows an embodiment of an IC package 230 without a heat sink attached as described above. The integrated heat spreader 230 is shown in an embodiment formed as a package cover. The edges of the integrated heat spreader 230 form an enclosure with the substrate 220 where the die (not shown) is substantially enclosed. In one embodiment, an opening 232 is included in the integrated heat spreader 230. In one embodiment, the opening provides a relief for variations in pressure due to thermal changes in the die.

Figure 3A:
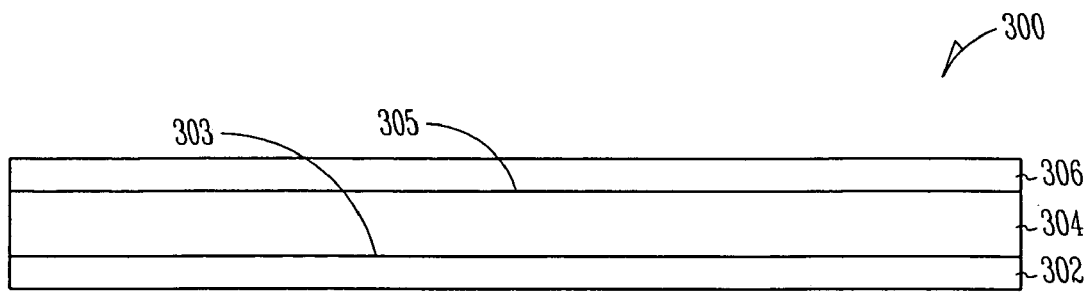
FIG. 3A illustrates a side view of a thermal interface device according to one embodiment of the invention.

FIG. 3A shows a thermal interface device 300 according to an embodiment of the invention. The thermal interface device 300 includes a first metal containing layer 302, a heat conducting structure 304, and a second metal conducting layer 306. In one embodiment, only the heat conducting structure 304 and the first metal containing layer 302 are used.

In one embodiment, the first metal containing layer 302 and the second metal conducting layer 306 are plastically deformable under certain conditions of temperature and pressure. In one embodiment, the first metal containing layer 302 and the second metal conducting layer 306 both include solder layers. In one embodiment, the first metal containing layer 302 and the second metal conducting layer 306 include solders of different compositions. Suitable metal containing layers include, but are not limited to tin (Sn), indium (In), and silver (Ag). Alloys of tin, indium and silver, with each other, or with other metals are also within the scope of the invention.

In one embodiment, the heat conducting structure 304 includes carbon. In one embodiment, the heat conducting structure 304 includes woven carbon fibers. In one embodiment, the heat conducting structure 304 includes pyrolized carbon. In one embodiment, the heat conducting structure 304 includes a diamond, or diamond like carbon film. Other materials with a high heat conductivity are also included in embodiments of the invention.

A first interface 303 is shown between the heat conducting structure 304 and the first metal containing layer 302. A second interface 305 is shown between the heat conducting structure 304 and the second metal conducting layer 306. In one embodiment, the first interface 303 is continuous across an entire surface of both the heat conducting structure 304 and the first metal containing layer 302. In one embodiment, the second interface 305 is continuous across an entire surface of both the heat conducting structure 304 and the second metal containing layer 306.

In one embodiment, the first interface 303 is formed using plastic deformation of the first metal containing layer 302. In an operation such as cold forming, at least a portion of the material being formed deforms plastically. After cold forming the first metal containing layer 302 against the heat conducting structure 304, a number of cold formed features are observed at the first interface 303. In one cold formed feature, the deformation causes the deforming portion of the material to flow in a conforming manner into surface features of a mating surface. In this way, substantially all gaps present at the first interface 303 are removed as the first metal containing layer 302 is deformed into surface features on the heat conducting structure 304.

In one embodiment, a cold formed feature includes a mechanical bond that is formed at the first interface during plastic deformation. In a mechanical bond, certain portions of the first metal containing layer 302 flow around asperities or surface features of the heat conducting structure 304. After deformation is complete, the interface is held together mechanically by the asperities or surface features being embedded within the flowed portion of the first metal containing layer 302. This is in contrast to chemical bonding where actual bonds are formed between atoms of the first metal containing layer 302 and atoms of the heat conducting structure 304. In one embodiment, at least one of the interface surfaces is roughened to enhance a mechanical bond. In one embodiment, a combination of chemical bonding, such as a formation of intermetallic compounds, and mechanical bonding are formed at the first interface 303.

In one embodiment, a cold formed feature includes work hardening of the first metal containing layer 302. The plastic deformation of portions of the first metal containing layer 302 acts to raise the hardness and strength of the first metal containing layer 302.

In one embodiment, the plastic deformation takes place below a melting temperature of the material being deformed. Once a material, such as the first metal containing layer 302, is in its liquid state, wetting of the liquid against the other surface, such as the heat conducting structure 304 becomes an issue. Due to chemical incompatibility, a liquid first metal containing layer 302 may not wet well against the heat conducting structure 304. In such circumstances, undesirable voids will form at the first interface 303. The voids are undesirable because they do not conduct heat effectively, and they provide less effective mechanical strength at the interface 303. By maintaining the temperature below a melting temperature of the first metal containing layer 302, issues of wetting at the interface 303 are avoided.

In one embodiment, the plastic deformation takes place above ambient temperatures. As temperature increases, the strength of the first metal containing layer 302 decreases. In this way, the force necessary to cause plastic deformation can be adjusted by varying the temperature. By maintaining the temperature above ambient temperatures, plastic deformation is accomplished with lower forces, and the first metal containing layer 302 flows better into surface features of the heat conducting structure 304 with advantages such as better interface contact, and higher mechanical strength as discussed above. In one embodiment, the plastic deformation takes place at a temperature between approximately 30° C. and 157° C.

In one embodiment the first metal containing layer 302 is reflowed, or raised above the melting temperature. When reflowing the first metal containing layer 302, no press tooling is required to create plastic deformation. If good wetting conditions exist, reflowing has a further advantage of providing very good interfacial contact.

In order to increase wetting of the first metal containing layer 302 against the heat conducting structure 304, an intermediate coating layer or layers can be utilized. One good characteristic of an intermediate layer, or series of layers includes barrier properties where diffusion of adjacent materials in the intermediate layer or layers is reduced. Another good characteristic of an intermediate layer, or series of layers includes favorable surface energy states of the adjacent materials such that wetting of liquid layers is encouraged. Another good characteristic of an intermediate layer, or series of layers includes a potential for strong chemical bonding between adjacent layers such as formation of intermetallic compounds at interfaces. In one embodiment, at least one intermediate layer is included at a reflowed interface.

In one embodiment, the second interface 305 is formed at least partially using plastic deformation. In one embodiment, the second interface is formed using reflowing techniques. In one embodiment, both the first interface 303 and the second interface 305 are formed at least partially using plastic deformation. In one embodiment, both the first interface 303 and the second interface 305 are formed reflowing techniques. In one embodiment, the first interface 303 and the second interface 305 are formed concurrently in a single operation, such as stamping, or reflowing, etc. in combination with the heat conducting structure 304.

Figure 3B:
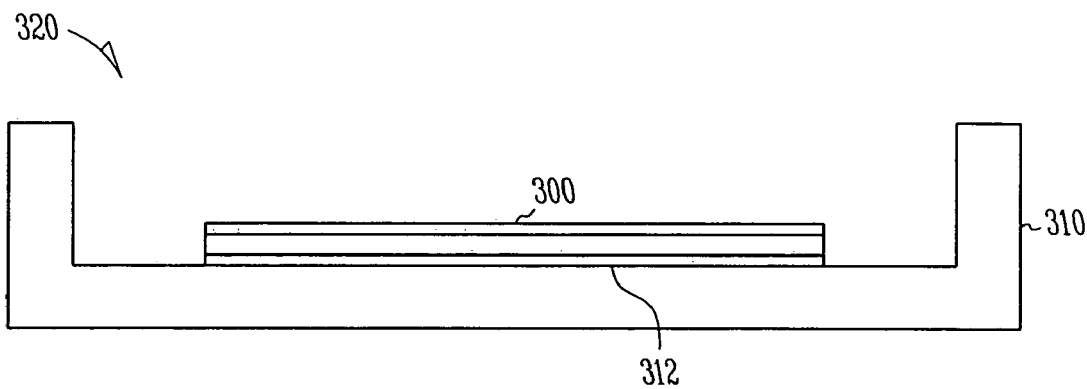
FIG. 3B illustrates a side view of an assembly including a thermal interface device according to one embodiment of the invention.

FIG. 3B shows a heat conducting assembly 320, including the thermal interface device 300 further attached to an integrated circuit package cover 310. In one embodiment, the integrated circuit package cover 310 includes an integrated heat spreader. In one embodiment the integrated circuit package cover 310 is formed from copper, although other heat conducting materials are within the scope of the invention. In one embodiment, the integrated circuit package cover 310 is further coated with nickel (Ni) on at least a portion of its exterior surfaces to provide desirable chemical interaction properties with its environment, and other components. In one embodiment, at least a portion of the nickel (Ni) portion is further coated with gold (Au) to provide desirable chemical interaction properties with its environment, and other components.

FIG. 3B further shows an cover interface 312 between the first metal containing layer 302 and the integrated circuit package cover 310. In one embodiment the cover interface 312 is formed at least partially using plastic deformation. In one embodiment, the cover interface 312 is formed using reflowing techniques.

Figure 3C:
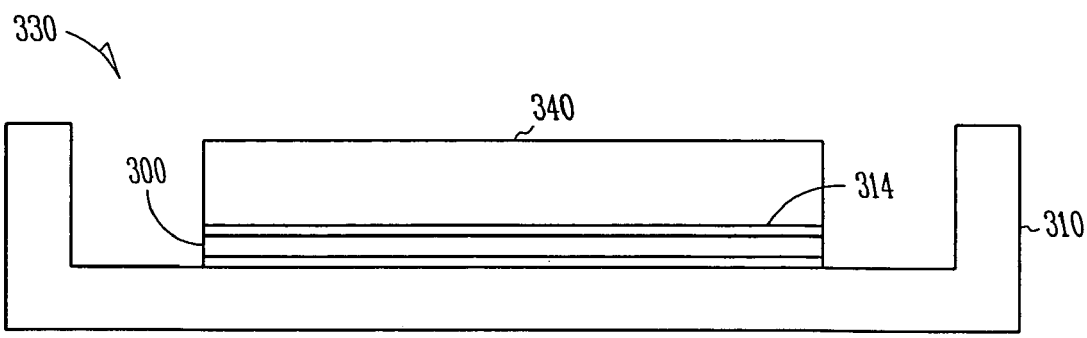
FIG. 3C illustrates a side view of an assembly including a thermal interface device according to one embodiment of the invention.

FIG. 3C shows a chip assembly 330 further including an integrated circuit chip 340. In one embodiment, the integrated circuit chip 340 includes a processor chip. In one embodiment, at least a portion of the thermal interface device 300 is attached to the integrated circuit package cover 310 using methods described above prior to attaching the heat conducting assembly 320 to the integrated circuit chip 340. For example, in one embodiment, the first metal containing layer 302 and the heat conducting structure 304 are attached to the integrated circuit package cover 310 separately, while the second metal containing layer 306 is attached to the integrated circuit chip 340 separately. The two sub-assemblies are then coupled together to form the chip assembly 330 as illustrated in FIG. 3C. In one embodiment, the thermal interface device 300 as shown in FIG. 3A is first attached directly to the integrated circuit package cover 310. This sub-assembly is then coupled to the integrated circuit chip 340. One of ordinary skill in the art, having the benefit of the present disclosure will recognize that other orders of assembly are also possible within the scope of the invention.

In one embodiment, a diamond heat conducting structure 304 is received as a single component, and placed within the chip assembly during assembly as described above. In one embodiment, a composite roll stock is used including layers of the first metal containing layer 302, and the heat conducting structure layer 304. A desired geometry of a thermal interface device 300 is cut to size. In one embodiment, the thermal interface device 300 is stamped out to size using a cutting die. In one embodiment, plastic deformation is induced in a metal containing layer concurrently with a stamping operation. In one embodiment, a composite roll stock of a first metal containing layer 302, and a heat conducting structure layer 304 further includes a second metal containing layer 306.

In selected embodiments using both a first metal containing layer 302 and a second metal containing layer 306, the first metal containing layer 302 and the second metal containing layer 306 may be the same composition as each other, or they may be of different compositions. The ability to select metal containing layers of different compositions is advantageous in certain embodiments, because a different metal containing layer can be selected for each interface. For example, the first metal containing layer can be selected to be compatible with the integrated circuit package cover 310, while the second metal containing layer 306 can be selected to be compatible with the chip 340.

Figure 4A:
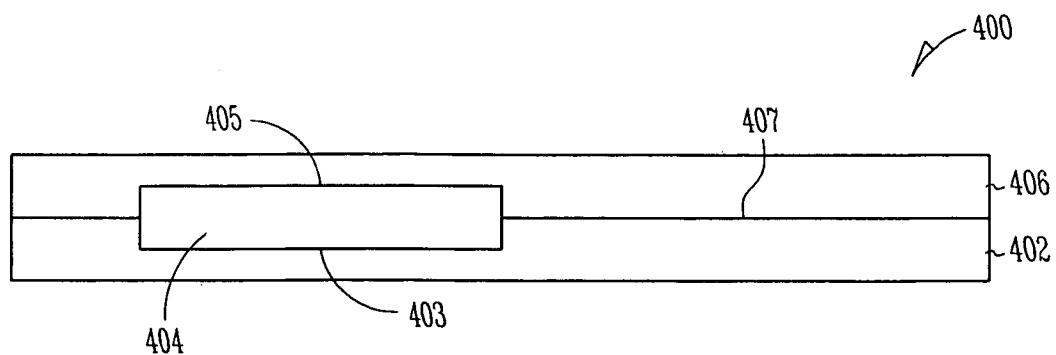
FIG. 4A illustrates a side view of another thermal interface device according to one embodiment of the invention.

FIG. 4A shows an embodiment of a thermal interface device 400 according to an embodiment of the invention. The thermal interface device 400 includes a first metal containing layer 402, a heat conducting structure 404, and a second metal conducting layer 406. In one embodiment, only the heat conducting structure 404 and the first metal containing layer 402 are used.

In one embodiment, the first metal containing layer 402 and the second metal conducting layer 406 are plastically deformable under certain conditions of temperature and pressure. In one embodiment, the first metal containing layer 402 and the second metal conducting layer 406 both include solder layers. In one embodiment, the first metal containing layer 402 and the second metal conducting layer 406 include solders of different compositions. Suitable metal containing layers include, but are not limited to tin (Sn), indium (In), and silver (Ag). Alloys of tin, indium and silver, with each other, or with other metals are also within the scope of the invention.

In one embodiment, the heat conducting structure 404 includes carbon. In one embodiment, the heat conducting structure 404 includes woven carbon fibers. In one embodiment, the heat conducting structure 304 includes pyrolized carbon. In one embodiment, the heat conducting structure 404 includes a diamond, or diamond like carbon film. Other materials with a high heat conductivity are also included in embodiments of the invention.

A first interface 403 is shown between the heat conducting structure 404 and the first metal containing layer 402. A second interface 405 is shown between the heat conducting structure 404 and the second metal conducting layer 406. In the embodiment illustrated in FIG. 4A, a third interface 407 is shown between the first metal containing layer 402 and the second metal conducting layer 406. In one embodiment, the heat conducting structure 404 is located over a fraction of the total area of the thermal interface device 400.

Figure 4B:
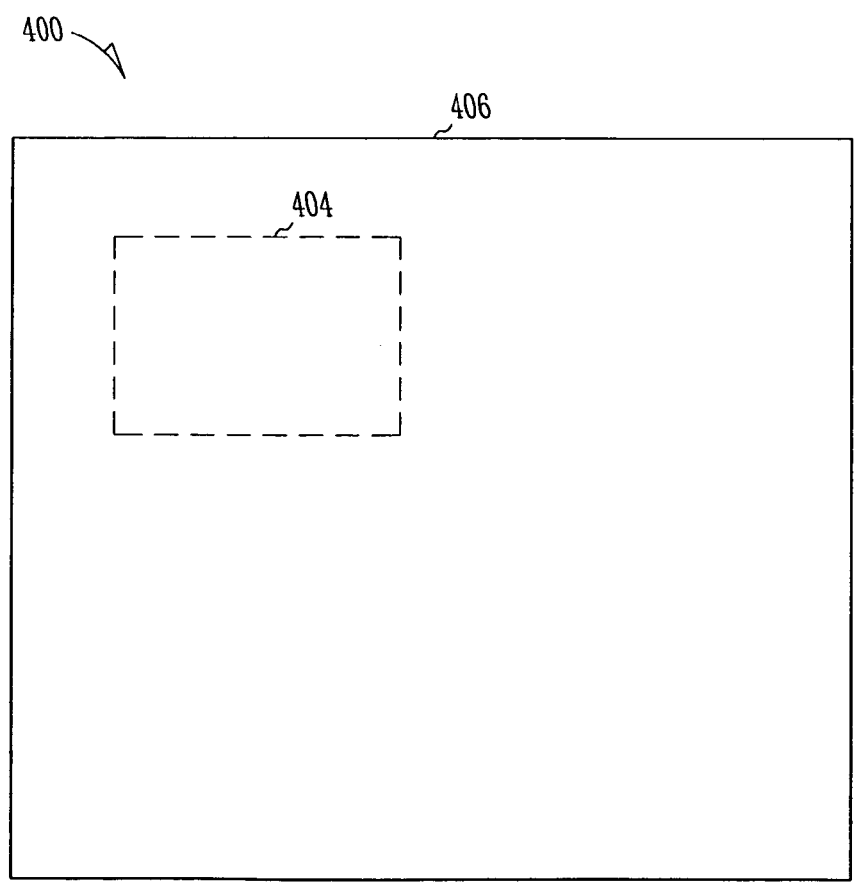
FIG. 4B illustrates a top view of a thermal interface device according to one embodiment of the invention.

FIG. 4B further illustrates one of several possible locations of the heat conducting structure 404 within the thermal interface device 400. Using a heat conducting structure 404 that is smaller than a total area of the thermal interface device 400 is beneficial for a number of reasons. One advantage includes cost savings. In embodiments where the heat conducting structure 404 includes diamond, for example, reducing the size of the heat conducting structure 404 leads to a substantial savings in material cost. Heat distribution remains effective because the heat conducting structure 404 can be located only over areas of a chip that produce large amounts of heat.

In one embodiment, one or more of the interfaces 403, 405, and 407 are formed using plastic deformation as described above. In one embodiment, one or more of the interfaces 403, 405, and 407 are formed using reflowing techniques as described above. Although the thermal interface device 400 is shown utilizing both a first metal containing layer 402 and a second metal conducting layer 406, other embodiments include only one metal containing layer used to form at least one interface as described above.

Figure 4C:
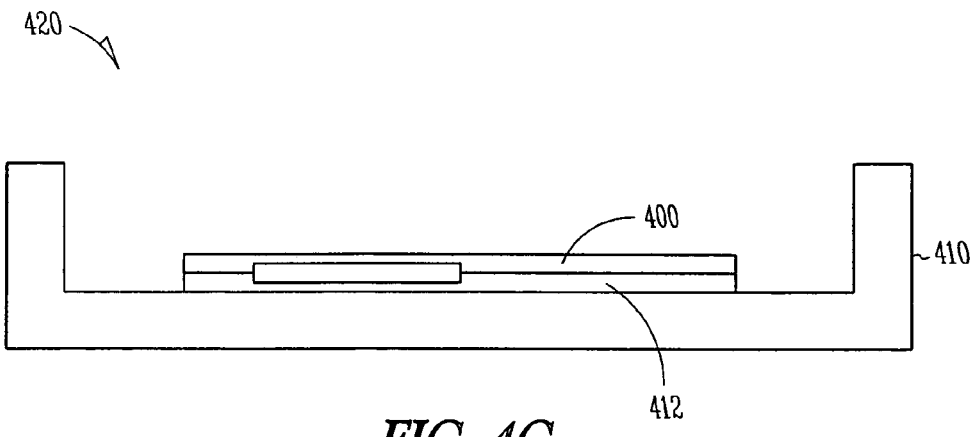
FIG. 4C illustrates a side view of an assembly including a thermal interface device according to one embodiment of the invention.

FIG. 4C shows a heat conducting assembly 420, including the thermal interface device 400 further attached to an integrated circuit package cover 410. In one embodiment, the integrated circuit package cover 410 includes an integrated heat spreader. Similar to embodiments described above, in one embodiment the integrated circuit package cover 410 is formed from copper, although other heat conducting materials are within the scope of the invention. In one embodiment, the integrated circuit package cover 410 is further coated with nickel (Ni) on at least a portion of its exterior surfaces to provide desirable chemical interaction properties with its environment, and other components. In one embodiment, at least a portion of the nickel (Ni) portion is further coated with gold (Au) to provide desirable chemical interaction properties with its environment, and other components.

Figure 4D:
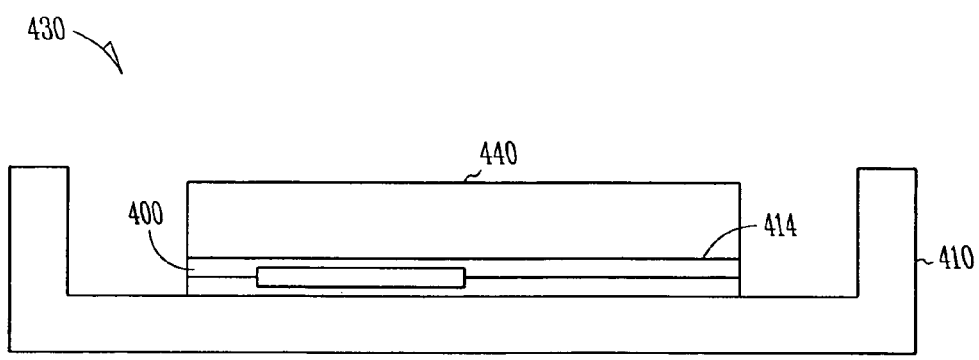
FIG. 4D illustrates a side view of an assembly including a thermal interface device according to one embodiment of the invention.

FIG. 4D shows a chip assembly 430 further including an integrated circuit chip 440. In one embodiment, the integrated circuit chip 440 includes a processor chip. In one embodiment, at least a portion of the thermal interface device 400 is attached to the integrated circuit package cover 410 using methods described above prior to attaching the heat conducting assembly 420 to the integrated circuit chip 440. For example, in one embodiment, the first metal containing layer 402 and the heat conducting structure 404 are attached to the integrated circuit package cover 410 separately, while the second metal containing layer 406 is attached to the integrated circuit chip 440 separately. The two sub-assemblies are then coupled together to form the chip assembly 430 as illustrated in FIG. 4D. In one embodiment, an embodiment of a thermal interface device is first attached directly to the integrated circuit package cover 410. This sub-assembly is then coupled to the integrated circuit chip 440. One of ordinary skill in the art, having the benefit of the present disclosure will recognize that other orders of assembly are also possible within the scope of the invention.

CONCLUSION

Devices and methods including thermal interface devices as described above include advantages such as improved interfacial strength, and improved interfacial contact. This in turn leads to improved heat conduction away from hot areas of a chip. Embodiments described above further include advantages of composite thermal interface devices that provide reduced device cost by limiting use of expensive materials such as diamond, or gold. Device cost is also reduced in a number of embodiments by reducing a number of manufacturing steps in the formation of integrated circuit devices.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of manufacturing a thermal interface device, comprising:
    placing a heat conducting structure on a first metal containing layer;
    attaching the first metal containing layer to the heat conducting structure; and
    attaching the first metal containing layer to a component surface;
    wherein, at least one attaching operation of the first metal containing layer includes plastic deformation of the first metal containing layer into surface features along a deforming interface at a temperature lower than a melting temperature of the first metal containing layer.

2. The method of claim 1, further including plastic deformation of the first metal containing layer at a temperature higher than ambient temperatures.

3. The method of claim 1, wherein placing the heat conducting structure on the first metal containing layer includes placing a heat conducting structure that covers a fraction of a side of the first metal containing layer.

4. The method of claim 1, wherein attaching the first metal containing layer to the heat conducting structure includes attaching an indium solder layer to the heat conducting structure.

5. The method of claim 1, further including attaching a second metal containing layer to the heat conducting structure substantially opposite the first metal containing layer.

6. The method of claim 5, wherein attaching the second metal containing layer to the heat conducting structure includes attaching an indium solder layer to the heat conducting structure.

7. The method of claim 5, further including selecting a different material for the first metal containing layer and the second metal containing layer.

8. The method of claim 1, wherein placing the heat conducting structure on the first metal containing layer includes placing a diamond film on the first metal containing layer.

9. The method of claim 1, wherein placing the heat conducting structure on the first metal containing layer includes placing a heat conducting structure chosen from a group consisting of woven carbon fibers and pyrolized carbon.

10. The method of claim 1, wherein attaching the first metal containing layer to a component surface includes attaching the first metal containing layer to an integrated heat spreader surface.

11. The method of claim 1, wherein attaching the first metal containing layer to a component surface includes attaching the first metal containing layer to a integrated circuit chip surface.

12. A processor assembly, comprising:
a processor chip attached to a substrate;
a thermal interface device coupled to a surface of the processor chip, including:
a first metal containing layer;
a second metal containing layer stacked over the first metal containing layer with a first side attached to the surface of the processor chip;
a substantially planar carbon structure located between at least a portion of the first metal containing layer and the second metal containing layer; and
an integrated circuit package cover coupled to the first metal layer, the integrated circuit package cover substantially enclosing the processor chip and the thermal interface device within a volume on the substrate.

13. The processor assembly of claim 12, wherein the substantially planar carbon structure completely separates the first metal containing layer and the second metal containing layer.

14. The processor assembly of claim 12, wherein the substantially planar carbon structure includes a diamond film.

15. The processor assembly of claim 12, wherein the substantially planar carbon structure is chosen from a group consisting of woven carbon fibers and pyrolized carbon.

16. The processor assembly of claim 12, wherein the first metal containing layer includes solder.

17. The processor assembly of claim 12, wherein the second metal containing layer includes solder.

18. The processor assembly of claim 12, wherein the first metal containing layer and the second metal containing layer include substantially pure indium (In).

19. The processor assembly of claim 12, wherein the first metal containing layer is different from the second metal containing layer.

20. The processor assembly of claim 12, further including a heat sink coupled to the integrated circuit package cover.

21. The processor assembly of claim 12, wherein at least one metal containing layer includes mechanical bond features at an interface.

22. An information handling system, comprising:
a non-volatile memory;
a system bus coupled to the non-volatile memory;
a processor chip assembly coupled the system bus, the processor chip assembly including:
a processor chip attached to a substrate;
a thermal interface device coupled to a surface of the processor chip, including:
a first metal containing layer;
a second metal containing layer stacked over the first metal containing layer with a first side attached to the surface of the processor chip;
a substantially planar carbon structure located between at least a portion of the first metal containing layer and the second metal containing layer; and
an integrated heat spreader coupled to the first metal containing layer.

23. The information handling system of claim 22, wherein the first side of the second metal containing layer is attached to a backside of the processor chip in flip-chip orientation.

24. The information handling system of claim 22, wherein the non-volatile memory includes a flash memory.

25. The information handling system of claim 22, wherein the substantially planar carbon structure includes a diamond film.

26. The information handling system of claim 22, wherein the first metal containing layer and the second metal containing layer include substantially pure indium (In) solder.

27. The information handling system of claim 22, wherein at least one metal containing layer includes mechanical bond features at an interface.

* * * * *

UNITED STATES PATENT AND TRADEMARK OFFICE
CERTIFICATE OF CORRECTION

PATENT NO. : 6,987,671 B2 Page 1 of 1
APPLICATION NO. : 10/608405
DATED : January 17, 2006
INVENTOR(S) : Houle It is certified that error appears in the above-identified patent and that said Letters Patent is hereby corrected as shown below:

In column 9, line 34, in Claim 11, after "layer to" delete "a" and insert -- an --, therefor.

In column 10, line 25, in Claim 22, after "coupled" insert -- to --.

Signed and Sealed this

Thirtieth Day of December, 2008

JON W. DUDAS
*Director of the United States Patent and Trademark Office*